(12) United States Patent
Truessel et al.

(10) Patent No.: US 12,444,692 B2
(45) Date of Patent: Oct. 14, 2025

(54) POWER MODULE COMPRISING A SEMICONDUCTOR MODULE COMPONENT AND AN ALIGNMENT PART, AND METHOD FOR FORMING THE POWER MODULE

(71) Applicant: Hitachi Energy Ltd, Zürich (CH)

(72) Inventors: Dominik Truessel, Bremgarten (CH); Milad Maleki, Untersiggenthal (CH); Fabian Fischer, Baden (CH); Lluis Santolaria, Olten (CH)

(73) Assignee: Hitachi Energy Ltd, Zürich (CH)

( * ) Notice: Subject to any disclaimer, the term of this patent is extended or adjusted under 35 U.S.C. 154(b) by 0 days.

(21) Appl. No.: 19/109,527

(22) PCT Filed: Aug. 10, 2023

(86) PCT No.: PCT/EP2023/072191
§ 371 (c)(1),
(2) Date: Mar. 6, 2025

(87) PCT Pub. No.: WO2024/052044
PCT Pub. Date: Mar. 14, 2024

(65) Prior Publication Data
US 2025/0259941 A1    Aug. 14, 2025

(30) Foreign Application Priority Data
Sep. 9, 2022   (EP) .................... 22194844

(51) Int. Cl.
*H01L 23/544* (2006.01)
*H01L 21/50* (2006.01)
(Continued)

(52) U.S. Cl.
CPC ............ *H01L 23/544* (2013.01); *H01L 21/50* (2013.01); *H01L 23/053* (2013.01);
(Continued)

(58) Field of Classification Search
CPC ..... H01L 23/544; H01L 21/50; H01L 23/552; H01L 24/72; H01L 25/072; H01L 23/053;
(Continued)

(56) References Cited

U.S. PATENT DOCUMENTS 10,319,652 B2 * 6/2019 Lin .................. H01L 23/492
2009/0261472 A1 * 10/2009 Bayerer ............ H01L 24/06
257/E23.101
(Continued)

FOREIGN PATENT DOCUMENTS

CN    109219233 A    1/2019
CN    209282459 U    8/2019
(Continued)

OTHER PUBLICATIONS

European Patent Office, Communication Under Rule 71(3) EPC Intention to grant, issued in EP Patent Application No. Application No. 22 194 844.1, dated Feb. 3, 2025, 51 pages.
(Continued)

*Primary Examiner* — Britt D Hanley
*Assistant Examiner* — Victor V Barzykin
(74) *Attorney, Agent, or Firm* — Procopio, Cory, Hargreaves & Savitch LLP

(57) ABSTRACT

A power module having an alignment part fixed on a lateral top surface (10T) of a semiconductor module component. The semiconductor module component has at least one terminal which—at least in places—is orientated vertically with respect to the lateral top surface of the semiconductor module component and for the purpose of alignment along lateral directions, is located at least partly within the at least one recessed portion. Along a vertical direction, the at least one terminalprotrudes beyond the at least one recessed portion. The at least one recessed portion is located on a side surface of the alignment part, wherein the at least one
(Continued)

recessed portion is a vertical slot being an open recess on the side surface of the alignment part, and wherein the slot is not a through-hole being completely surrounded by inner walls of the at least one recessed portion in lateral directions.

14 Claims, 8 Drawing Sheets

(51) Int. Cl.
      *H01L 23/053*     (2006.01)
      *H01L 23/31*      (2006.01)
      *H01L 23/552*     (2006.01)
      *H01L 25/07*      (2006.01)
      *H01L 25/10*      (2006.01)
      *H01R 12/58*      (2011.01)
      *H05K 7/14*       (2006.01)

(52) U.S. Cl.
      CPC ........ *H01L 23/3107* (2013.01); *H01L 23/552* (2013.01); *H01L 25/072* (2013.01); *H01L 25/105* (2013.01); *H01R 12/585* (2013.01); *H05K 7/1432* (2013.01); *H01L 2223/54426* (2013.01); *H05K 7/142* (2013.01); *H05K 2201/2036* (2013.01); *H05K 2203/167* (2013.01)

(58) Field of Classification Search
      CPC ...... H01L 23/3107; H01L 2223/54426; H01R 12/585; H05K 7/1432; H05K 7/142; H05K 2203/167
      See application file for complete search history.

(56) References Cited

U.S. PATENT DOCUMENTS

| | | | |
|---|---|---|---|
| 2013/0112994 A1* | 5/2013 | Sawada | H01L 25/072 257/77 |
| 2014/0035119 A1* | 2/2014 | Permuy | H01L 23/051 257/690 |
| 2016/0247735 A1* | 8/2016 | Lin | H01L 23/492 |
| 2020/0194322 A1* | 6/2020 | Lin | H01L 23/10 |
| 2021/0358869 A1* | 11/2021 | Sato | H05K 3/301 |

FOREIGN PATENT DOCUMENTS

| | | |
|---|---|---|
| CN | 209948970 U | 1/2020 |
| CN | 211126138 U | 7/2020 |
| CN | 112016262 A | 12/2020 |
| DE | 102009025113 A1 | 12/2010 |
| DE | 102010003367 A1 | 9/2011 |
| JP | 2000260513 A | 9/2000 |
| JP | 2009-4380 A | 1/2009 |
| JP | 2011187564 A | 9/2011 |
| JP | 2019-067970 A | 4/2019 |
| JP | 2021-180278 A | 11/2021 |

OTHER PUBLICATIONS

European Patent Office, Communication pursuant to Article 94(3) EPC, issued in EP Patent Application No. 22 194 844.1, dated Jul. 24, 2024, 5 pages.

* cited by examiner

POWER MODULE COMPRISING A SEMICONDUCTOR MODULE COMPONENT AND AN ALIGNMENT PART, AND METHOD FOR FORMING THE POWER MODULE

The present application is a national stage entry of International Patent Application No. PCT/EP2023/072191, filed on Aug. 10, 2023, which claims priority to the European Application No. 22194844.1 filed on Sep. 9, 2022, which is hereby incorporated herein by reference as if set forth in full.

The present disclosure relates to a power module comprising a semiconductor module component and an alignment part as well as method for forming such a power module.

When implementing power modules, for instance power semiconductor modules, in various applications, the power modules shall be mechanically and electrically connected to control electronics like gate drivers or other integrated circuits configured for controlling the power modules. The control electronics can be arranged on an assembly board, such as on a control board which can be a printed circuit board. Such assembly board can be arranged on top of the power modules. The electrical connections between the power semiconductor module/s and the assembly board can be provided by terminals, for example by main terminals for instance in form of power terminals and/or auxiliary terminals in form of control terminals, of the power module/s.

Thus, there is a need for exactly placing the power module/s relative to the position of the assembly board for facilitating the process of mechanically and electrically interconnecting the power module/s to the assembly board. Moreover, when the terminals are inserted or pressed into contact holes of the assembly board, sufficient mechanical support for the terminals are desired so that the terminals can be inserted into the contact holes in a safe and efficient manner. Using an integrated alignment part may help in providing an efficient and simplified method for exactly placing the power module/s with respect to the position of the assembly board, for example for exactly placing the terminals, for instance in the form of main terminals and/or auxiliary terminals, of the power module/s with respect to the positions of the contact holes of the assembly board.

Document US 2021/358869 A1 describes a semiconductor device including a semiconductor module, a printed board and a positioning member. The semiconductor module includes a case that stores components, wherein the case has a front surface on which electrode terminals, control terminals (external terminals) and reference pins and are formed. The printed board includes terminal holes and is electrically connected to the control terminals that pass through and are attached to the terminal holes. Each of the four reference pins of the semiconductor module passes through a corresponding one of the four corners of the printed board. Moreover, positioning elements of the positioning member pass through the printed board. The positioning member is placed between the semiconductor module and the printed board. The positioning member has a front surface, wherein the positioning elements are formed on the front surface of the positioning member. The control terminals and the reference pins of the semiconductor module pass through the positioning member.

Embodiments of the disclosure, for instance as claimed in the independent claims, address the above shortcomings in the art in whole or in part. Further embodiments of the power module and of the method for forming a power module having an integrated alignment as well as of the method for interconnecting the power module/s to an assembly board, for instance to a control board, are subject matter of the further claims.

According to an embodiment of a power module, it comprises a semiconductor module component and an alignment part. The alignment part is fixed on a lateral top surface of the semiconductor module component. The alignment part comprises at least one recessed portion. The semiconductor module component comprises at least one terminal. The terminal is orientated—at least in places—vertically to the lateral top surface of the semiconductor module component. For the purpose of alignment along lateral directions, the terminal is located at least partly within the at least one recessed portion. Along a vertical direction, the at least one terminal protrudes beyond the at least one recessed portion.

Since the alignment part is fixed to the semiconductor module component, the alignment part is an integral part of the power module. If the power module is mechanically and electrically connected to an assembly board, the alignment part is located for instance between the semiconductor module component and the assembly board. Using the alignment part, a lateral position of the terminal can be adjusted exactly to a lateral position for instance of a contact hole of the assembly board. Moreover, the alignment part can provide mechanical support for the terminal so that the terminal can be inserted or pressed into the contact hole of the assembly board in a safe and simplified manner. In virtue of this aspect, a proper alignment of one or several terminals, for example of pin-shaped terminals, of the power module with respect to one or several contact holes of the assembly board, for instance of a control board, can be guaranteed. Hence, it can be avoided that some terminals would be bent or displaced and thus would not fit into the contact holes of the assembly board.

Here and in the following, for the sake of clarity and simplicity, features of the power module and of the method are sometimes described in connection with only one recessed portion and/or with only one terminal. It shall be understood, however, that such features may also be applied for the plurality of the recessed portions and/or the plurality of the terminals, respectively. It is possible that different recessed portions are formed alike or differently.

The terminals can be formed alike or differently. The power module can comprise more than one module component, for instance more than one semiconductor module component. The alignment part can be arranged on a single module component or on several module components. For instance, the alignment part is arranged on several module components which are laterally arranged to each other for forming for instance a Sixpack module, wherein the module components, for instance three module components, are arranged on a cooler in a row.

Hence, it is possible that the alignment part comprises a plurality of recessed portions including the at least one recessed portion mentioned above. Along one lateral direction, for instance along a horizontal direction, the recessed portions can be spaced apart from each other. The semiconductor module component can comprise a plurality of terminals including the at least one terminal mentioned above. Along the lateral direction, for instance along the horizontal direction, the terminals can be spaced apart from each other.

A vertical direction is understood to mean a direction which is directed perpendicular to the top surface of the semiconductor module component. A lateral direction is understood to mean a direction which is parallel to the top surface of the semiconductor module component. The vertical direction and the lateral direction are orthogonal to each other. The top surface of the semiconductor module component is a lateral surface which can be defined by two vectors directing for instance to a horizontal direction and a longitudinal direction. The horizontal direction can be a lateral direction along which the recessed portions of the alignment part or the terminals of the semiconductor module component or of the power module are spaced apart from each other. The longitudinal direction can be another lateral direction along which the terminals protrude over the side surface of the semiconductor module component. The recesses can extend along the longitudinal direction.

Along the lateral direction perpendicular to the horizontal direction, i.e. along the longitudinal direction, the at least one terminal or the terminals can be located in places sideways from a side surface of the semiconductor module component. It is also possible that the terminals extend vertically from a body of the module component. For the purpose of alignment along the lateral direction and for the purpose of mechanical support along the vertical direction, each of the plurality of terminals can be located at least partly within one of the recessed portions.

According to a further embodiment of the power module, the at least one recessed portion or the recessed portions is/are located on a side surface of the alignment part. In a plan view of the lateral top surface of the semiconductor module component, the at least one recessed portion and the at least one terminal can be located outside the lateral top surface of the semiconductor module component, e.g. outside the perimeter of the lateral top surface of the semiconductor module component.

According to a further embodiment of the power module, the at least one recessed portion is formed as a slot extending along the vertical direction through the alignment part. A slot is for instance an opening part on a side surface of the alignment part. Along the vertical direction, the slot can extend partially or completely through the alignment part. The slot, however, is not a through-hole which, in lateral directions, is completely surrounded by inner walls of the recessed portion. The slot is rather an open recess on the side surface of the alignment part. The slot can have a holding structure or a support structure for supporting and providing an alignment of a terminal in the vertical direction. The support structure is for instance not on the entire bottom of the slot. The support structure can have the form of a step but is not limited thereto. Also, the bottom portion of the terminal may have a stretching structure. After the terminal is aligned, the holding structure or the support structure is located for instance below the terminal in the case of a bottom surface. If the holding structure or the support structure has the form of a step on the sidewall of the slot, a laterally stretching structure, for instance a cross-bar of the terminal is arranged on a surface of the step.

According to a further embodiment of the power module, the at least one recessed portion comprises a holding structure which is configured for mechanically supporting the at least one terminal when the at least one terminal is pressed or inserted along the vertical direction towards a forward direction, for example towards the direction the tip of the terminal points to. Thus, the holding structure can provide alignment of the at least one terminal in the vertical direction. For instance, the whole terminal or at least part of the terminal is hold or carried by the holding structure of the recessed portion. The alignment of the at least one terminal can be realized both by: moving the module component with terminal/s towards the fixed assembly board, and moving the assembly board towards the fixed module component with terminal/s.

According to a further embodiment of the power module, the holding structure is provided by a step-like structure of an inner wall of the at least one recessed portion. The at least one terminal can comprise a laterally extending structure, for instance in form of a one-sided bar or in form of a cross-bar, wherein the laterally extending structure is arranged on a stepping surface of the step-like structure. In addition or as an alternative, the holding structure can also be provided by a bottom area of the at least one recessed portion. A lower part of the at least one terminal can be arranged on the bottom area of the at least one recessed portion. For inserting the at least one terminal, the holding structure or the lower bottom area does not extend over the entire cross-section of the recessed portion. The lower part of the at least one terminal is for instance a horizontal part which may have an extension to get in contact with the holding structure or with the lower bottom area of the recessed portion.

According to a further embodiment of the power module, the alignment part is electrically insulating. For example, the alignment part is made from an electrically insulating material. It is possible that the alignment part comprises a main body which is made from an electrically insulating material.

According to a further embodiment of the power module, it comprises a shielding layer configured for protecting the semiconductor module component against electromagnetic interference and/or for protecting the assembly board from electromagnetic interference with the power module, for instance in high voltage application. The shielding layer can be embedded within the alignment part. The shielding layer may be a layer made of electrically conductive materials. Since the shielding layer, however, is not configured to be assigned to any electrical polarities of the power module, even the shielding layer is embedded within the alignment part, the alignment part remains electrically insulating. For instance, when the shielding layer is embedded within the alignment part, the shielding layer does not have any parts which are accessible from outside. In other words, the shielding layer is completely embedded within the alignment part. It is also possible that the shielding layer is arranged on a top surface or on a bottom surface of the alignment part. In top view, however, it is conceivable that the shielding layer does not completely cover the top surface and/or the bottom surface of the alignment part. In general, the shielding layer shall not be in contact with other electrical parts except from ground contacts.

According to a further embodiment of the power module, the alignment part is mechanically connected to the semiconductor module component by a bonding layer, for instance after the alignment procedure. The bonding layer may be a gluing layer, an adhesive layer, or the like. In addition or as an alternative, the alignment part can be mechanically connected to the semiconductor module component by a snap-fit connection or by a clamping connection. Moreover, in addition or as a further alternative, the alignment part can be mechanically connected to the semiconductor module component by a pin-to-hole connection or by screw/s.

According to a further embodiment of the power module, the at least one terminal is a pin-shaped terminal or a press-fit terminal. The press-fit terminals can be inserted or pressed into contact holes of an assembly board and mechanically fixed to the contact holes of the assembly board without using additional connecting means.

According to a further embodiment of the power module, the alignment part comprises a plurality of recessed portions including the at least one recessed portion. The semiconductor module component can comprise a plurality of terminals including the at least one terminal. The terminals can be main terminals and/or auxiliary terminals. For the purpose of alignment along the lateral direction and for the purpose of mechanical support along the vertical direction, each of the plurality of terminals can be located at least partly within one of the recessed portions. The plurality of terminals can belong to a single module component or to several module components. Thus, each module component can be fixed to only one alignment part or several module components can be fixed to one common alignment part.

According to an embodiment of a method for fixing an alignment part, for instance an electrically insulating alignment part, comprising at least one recessed portion to a semiconductor module component comprising at least one terminal, the method comprises the step of positioning the alignment part in a tilted orientation with respect to a lateral top surface of the semiconductor module component for inserting the at least one terminal, which—at least in places—is orientated vertically to the lateral top surface of the semiconductor module component, into the at least one recessed portion of the alignment part, wherein the recessed portion is located at an edge region of the alignment part.

The method further comprises the step of moving the alignment part towards the lateral top surface of the semiconductor module component so that the alignment part reaches a horizontal orientation with respect to the lateral top surface of the semiconductor module component, wherein along a vertical direction, the at least one terminal protrudes beyond the at least one recessed portion, and wherein the at least one recessed portion is configured for aligning the at least one terminal in lateral directions and for providing the at least one terminal with additional mechanical support along the vertical direction. Thus, this can also provide alignment in the vertical direction. Moreover, the method further comprises fixing the alignment part to the semiconductor module component for forming a power module comprising the alignment part and the semiconductor module component.

For preventing misalignment or unwanted bending of the terminal/s, it is possible that the alignment part and/or the module component has an additional alignment structure providing for supporting a correct alignment between the module component and the alignment part. The alignment part can be aligned with the power module or with the module component/s using pins to holes in the terminals or in a mold body, or vice versa. It is also possible to align the alignment part on a side of the mold body, or at other places. Furthermore, for having an alignment between the alignment part and the power module or module component, for example between the alignment part and the mold body of the module component, it is possible to use a bedstop-structure or a guiding structure in the alignment part or in the module component. Also, a combined alignment and fixation method using snap-fit and/or screwing connection is possible. Regarding providing alignment in the vertical direction, it is noted that the alignment in vertical direction is possible if the terminal is low and is positioned in the vertical direction. If the terminal is too high, then the alignment tool will still act as support, while pressing the assembly board towards the terminal/s.

According to a further embodiment of the method, for electrically connecting the power module to an assembly board, the method comprises the step of positioning the power module and the assembly board one above the other along the vertical direction, wherein the assembly board has at least one contact hole for receiving the at least one terminal of the semiconductor module component. Furthermore, the at least one terminal is inserted into the at least one contact hole, wherein the at least one recessed portion of the alignment part comprises a holding structure which carries and mechanically supports the at least one terminal when the at least one terminal is pressed into the at least one contact hole. Here, the alignment of the at least one terminal can be realized in both situations, namely by: moving the module component with terminal/s towards the fixed assembly board, and moving the assembly board towards the fixed module component with terminal/s.

Hence, an arrangement comprising the power module according to any examples or embodiments described here and an assembly board is provided, wherein the power module and the assembly board are arranged one above the other along the vertical direction. The assembly board has at least one contact hole or several contact holes in which the at least one terminal of the plurality of terminals of the semiconductor module component is/are inserted.

The present disclosure comprises several aspects of a power module comprising at least one semiconductor module component and an alignment part and of a method for forming such a power module on the basis of their embodiments and examples. Every feature described with respect to one of the aspects is also disclosed herein with respect to the other aspect, even if the respective feature is not explicitly mentioned in the context of the specific aspect. For example, the method described in this disclosure is directed to a method for forming the power module described here. Thus, features and advantages described in connection with the method can be used for the power module, and vice versa.

While the disclosure is amenable to various modifications and alternative forms, specifics thereof are shown by way of example in the figures and will be described in detail. It should be understood, however, that the intention is not to limit the disclosure to the particular described embodiments and examples. On the contrary, the intention is to cover all modifications, equivalents, and alternatives falling within the scope of the disclosure defined by the appended claims.

The accompanying figures are included to provide a further understanding. In the figures, elements of the same structure and/or functionality may be assigned to the same reference signs. It is to be understood that the examples shown in the figures are illustrative representations and are not necessarily true to scale.

FIG. 1A schematically shows a general concept of a power module in cross-sectional view according to an example of the disclosure.

Figure 1A:
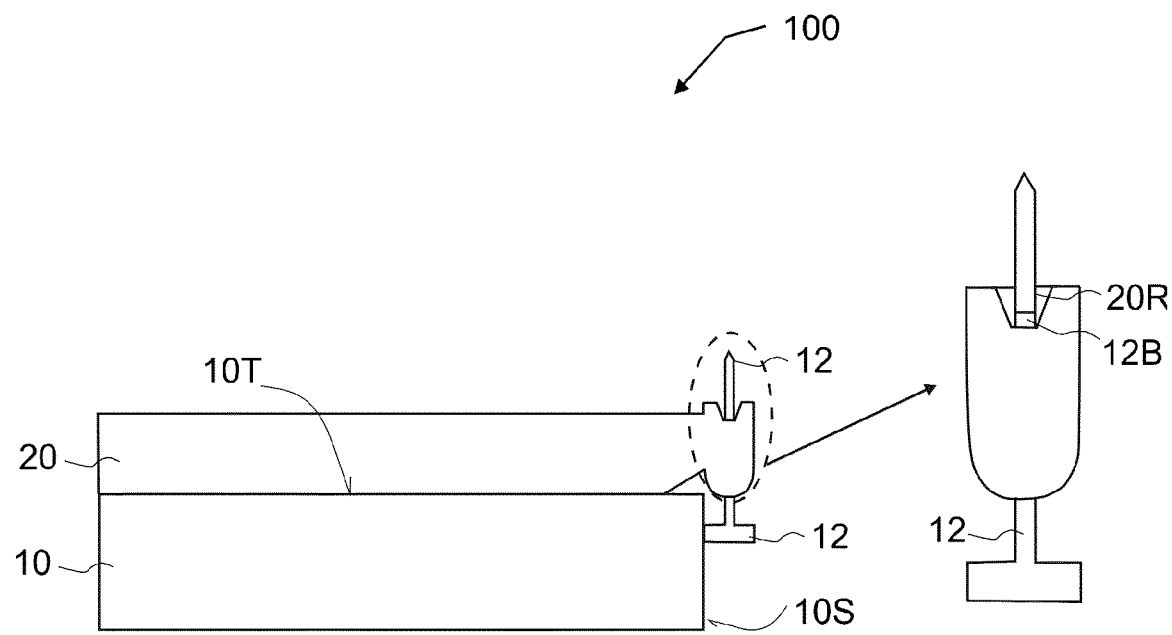
FIG. 1B shows—in top view—a terminal within a recess of the alignment part according to an example of the disclosure.

FIG. 1A shows a sectional view of a power module 100 according to an embodiment. The power module 100 comprises at least one module component 10, for instance one semiconductor module component 10. The module component 10 can be or comprise an electronic chip, a semiconductor chip, a sensor for instance for measuring temperature or movement, a switching device like IGBT, a power MOSFET made of silicon, silicon carbide, gallium nitride or other semiconductor material, a diode, a discrete device like resistor, capacitor, inductive component or a transistor, but is not limited thereto.

The power module 100 further comprises an alignment part 20. The alignment part 20 is arranged on the at least one semiconductor module component 10. For example, the alignment part 20 is mechanically fixed on a top surface 10T of the module component 10. The mechanical fixation of the alignment part 20 on the module component 10 can be realized e.g. by gluing, screwing, riveting or by forming a snap-fit connection or a clamping connection between the alignment part 20 and the module component 10, but is not limited thereto.

The alignment part 20 can be electrically insulating. For instance, the alignment part 20 is formed from an electrically insulating material. The alignment part 20 can be manufactured by a molding process, for instance by plastic injection molding. The alignment part 20 comprises at least one recessed portion 20R. The recessed portion 20R is formed for instance on a side surface 20S of the alignment part 20. The recessed portion 20R can be a vertical slot. The vertical slot is for instance an indentation on the side surface 20S of the alignment part 20. For example, the recessed portion 20R formed as a vertical slot extending along the vertical direction throughout the alignment part 20.

As shown in FIG. 1A, the recessed portion 20R is formed at an end portion of the alignment part 20. In a plane view of the top surface 10T of the module component 10, the recessed portion 20R may not overlap with the top surface 10T of the module component 10. Thus, the alignment part 20 is fixed on the module component 10 in such a way that in top view, the recessed portion 20R is located sidewards from the top surface 10T of the module component 10. Apart from FIG. 1A, it is conceivable that the recessed portion 20R overlaps with the top surface 10T of the module component 10 so that in top view, the recessed portion 20R is located on the top surface 10T of the module component 10.

The module component 10 comprises at least one terminal 12 or a plurality of terminals 12. The terminal 12 can be an auxiliary terminal which is for instance a control terminal and is to be connected to a control board. The terminal 12 can also be a power terminal or a main terminal. The terminal 12 may have a lateral portion and a vertical portion, wherein the lateral portion and the vertical portion can be provided by bending the terminal 12, i.e. bending a part of the lateral portion so that the bent part of the lateral portion becomes the vertical portion.

It is possible that the vertical portion has a press-fit connector at its vertical end portion. As shown in FIG. 1A, the lateral portion of the terminal 12 is parallel to the top surface 10T of the module component 10 and laterally protrudes beyond a side surface 10S of the module component 10. Thus, the lateral portion is directed vertically with respect to the side surface 10S of the module component 10. The vertical portion of the terminal 12 is perpendicular to the top surface 10T of the module component 10. Thus at least in places, the terminal 12 is orientated vertically to the lateral top surface 10T of the semiconductor module component 10.

For the purpose of alignment along lateral directions, the terminal 12 or the vertical portion of the terminal 12 is located at least partly within the at least one recessed portion 20R. The recessed portion 20R can have a side opening for receiving the terminal 12. Once the terminal 12 is located within the recessed portion 20R, a shift of the lateral position of the terminal 12 is limited resulting in an alignment of the position of the terminal 12. Along the vertical direction, the terminal 12, for instance a tip of the vertical portion of the terminal 12, protrudes beyond the recessed portion 20R and is freely accessible. In a plan view of the lateral top surface 10T of the semiconductor module component 10, the recessed portion 20R and the terminal 12 are located outside the lateral top surface 10T of the semiconductor module component 10.

Figure 2A:
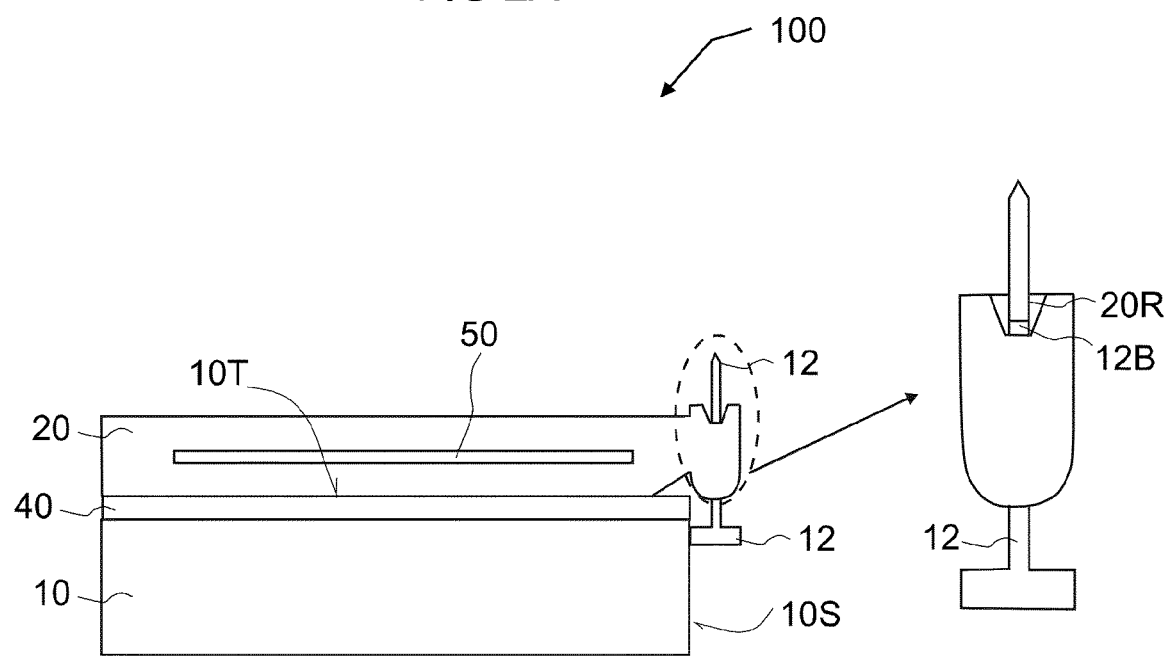
FIGS. 2A and 2B show further examples of the power module.

The power module 100 shown in FIG. 2A is basically identical to the power module 100 shown in FIG. 1A with the exception that FIG. 2A shows a bonding layer 40 arranged between the alignment part 20 and the module component 10. The bonding layer 40 can be an adhesive layer or a layer of glue which is used for mechanically connecting the alignment part 20 to the module component 10. Alternatively, for mechanically connecting the alignment part 20 to the module component 10, a snap-fit connection or screws may be used. This is shown for instance in FIGS. 5 and 6.

Figure 1B:
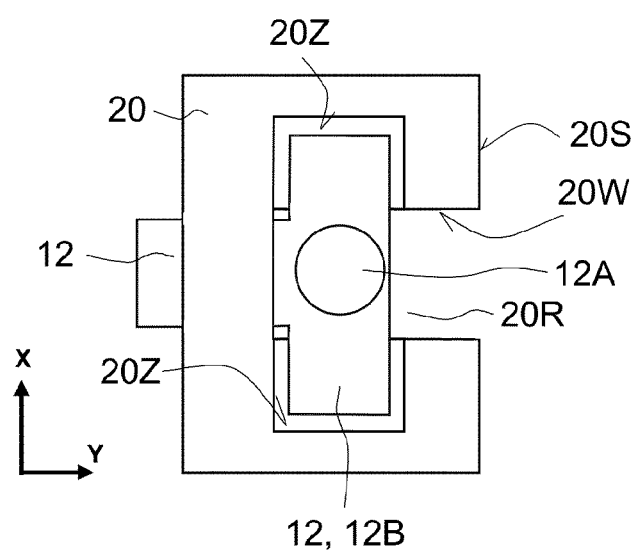

Another difference between FIGS. 1 and 2 is that according to FIG. 2A, the power module 100 comprises a shielding layer 50 which configured for protecting the module component 10 against electromagnetic interference or for protecting an assembly board 30 from interference with the power module 100. The shielding layer 50 can be embedded within the alignment part 20. The shielding layer 50 may be formed from an electrically conductive material. For example, a metallic sheet or partly conductive plastic materials can be embedded within the alignment part 20. Alternatively, it is possible for the assembly board 30 to be mounted on top of the power module 100 as shown for instance in FIGS. 5 and 6. The assembly board 30 can be a printed circuit board comprising control electronics.

Figure 2B:
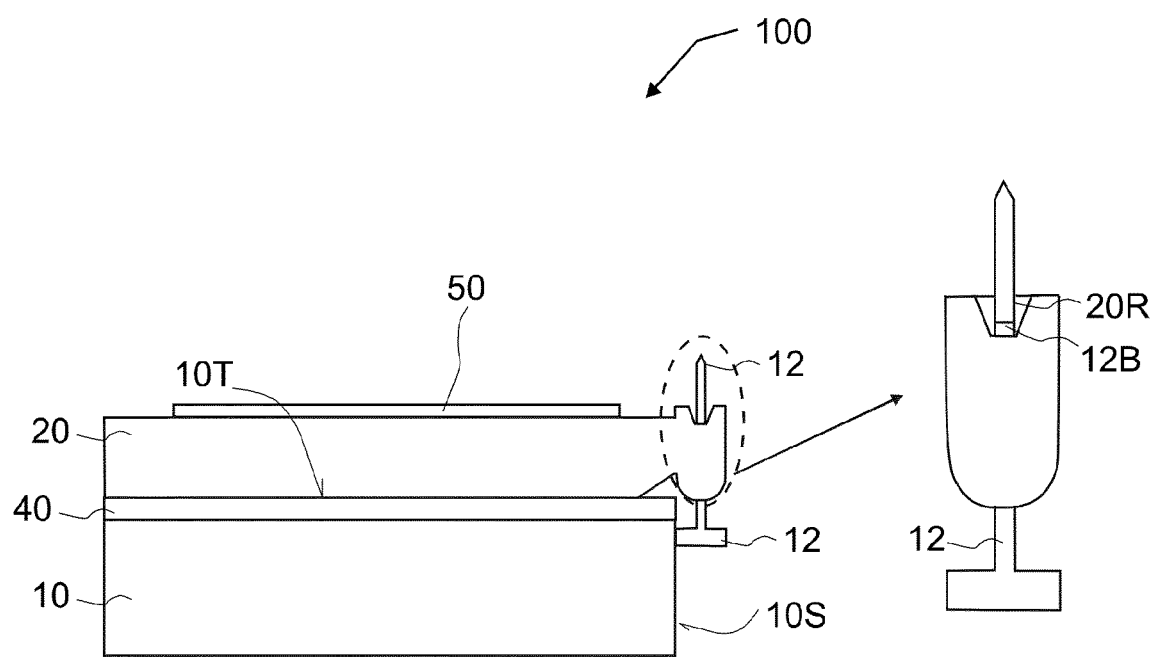

The power module 100 shown in FIG. 2B is basically identical to the power module 100 shown in FIG. 2A with the exception that the shielding layer 50 is arranged on a top surface of the alignment part 20. Apart from FIG. 2B, it is also possible that the shielding layer 50 is arranged on a bottom surface of the alignment part 20. In the latter case, the shielding layer 50 is arranged between the alignment part 20 and the module component 10.

Figure 3:
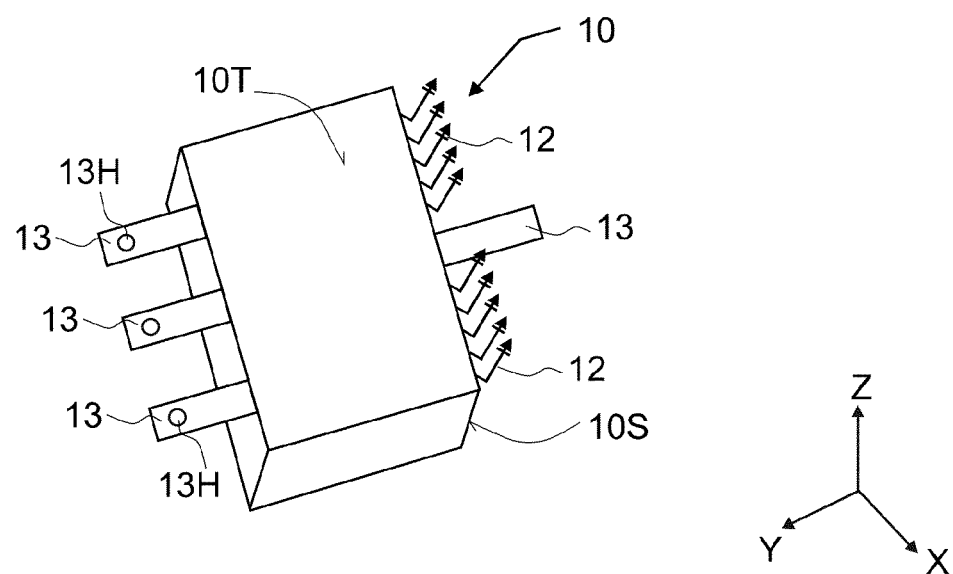
FIG. 3 shows an example of a semiconductor module component of the power module.
Figure 4A:
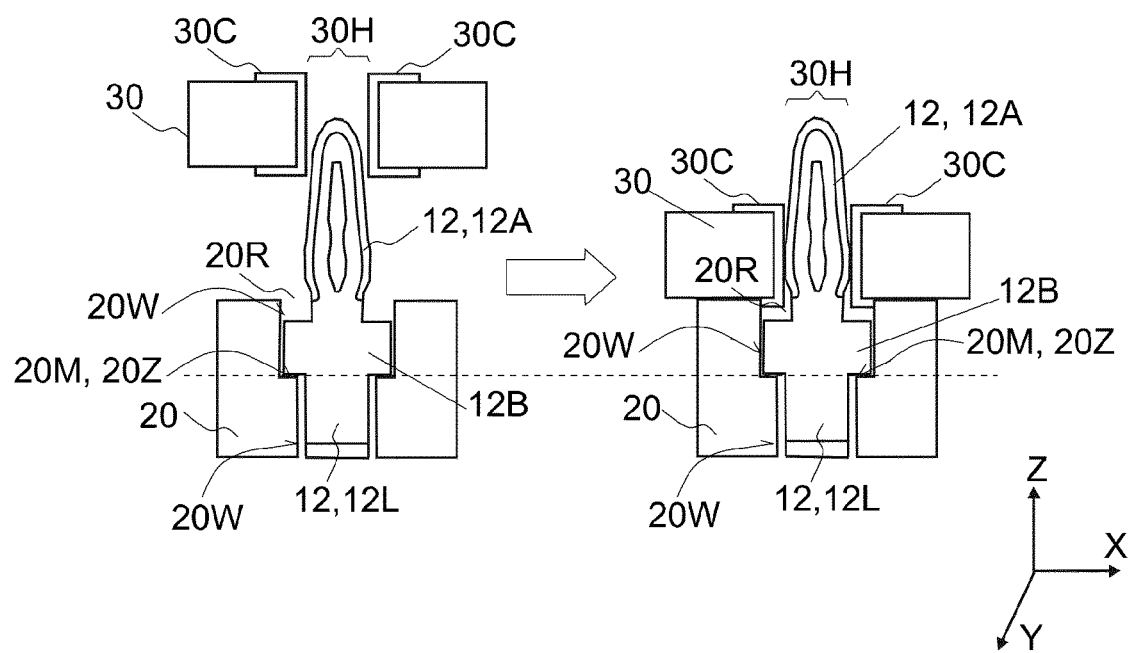
FIGS. 4A and 4B show examples of a terminal located in a recessed portion of the alignment part when the terminal is inserted into a contact hole of an assembly board.
Figure 4B:
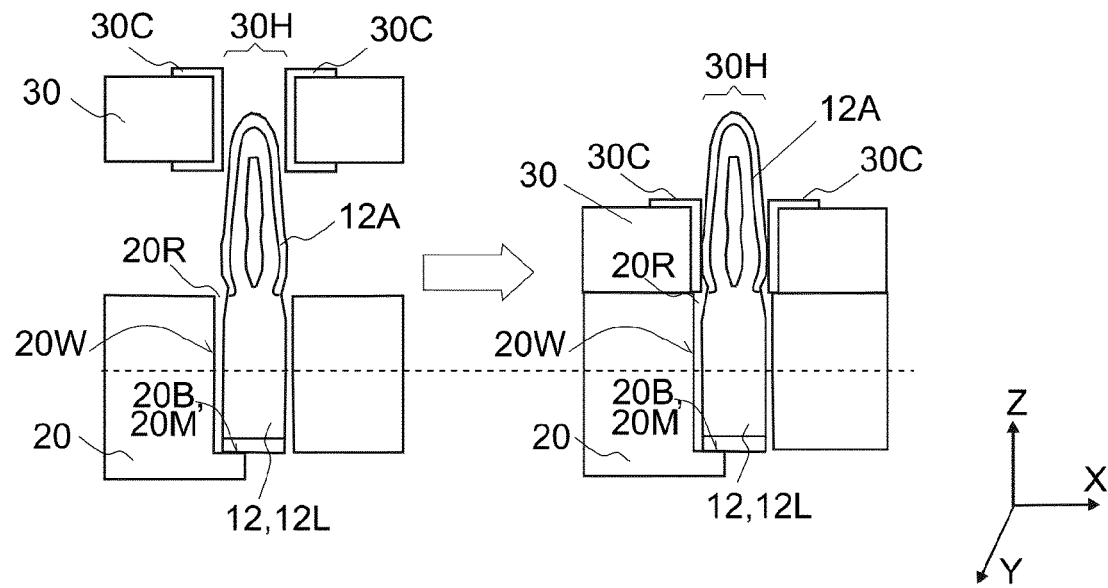

FIG. 3 shows an example a module component 10 of the power module 100 which is to be interconnected to an assembly board 30 shown for instance in FIGS. 4A and 4B. Here, for the sake of simplicity, the alignment part 20 on the top surface 10T of the module component 10 is not shown.

The module component 10 has a plurality of terminals 12, for example, auxiliary terminals 12, on its side surface 10S. For instance, the terminals 12 are pin-shaped terminals. The terminals 12 have vertical portions which are directed towards the vertical Z-direction. The module component 10 further comprises further terminals 13, for instance main terminals 13, extending in the lateral direction which are configured for instance for electrically connecting the module component 10. Apart from the Figures of this disclosure, it is possible that similar to the terminals 12, the main terminals 13 have lateral and vertical portions. Thus, the main terminals 13 may be bent. The main terminals 13 can be aligned using the alignment part 20 as well.

At least one of the main terminals 13 can have an opening 13H. The opening 13H can be configured for receiving a snap-fit portion 20H of the alignment part 20 for forming a snap-fit connection between the alignment part 20 and the module component 10. This is shown for instance in FIGS. 5 and 7A.

Once the alignment part 20 is attached to the top surface 10T of the module component 10, each of the terminals 12 is located in one corresponding recessed portion 20R of the alignment part 20. Thus, the terminals 12 can be positioned and aligned with respect to the positions of the recessed portions 20R of the alignment part 20 in lateral horizontal X-direction and in lateral longitudinal Y-direction.

The alignment part 20 can provide mechanical support for the terminals 12 when they are inserted into contact holes 30H of an assembly board 30 as shown in FIGS. 4A and 4B. Relating to the laterally extending structure 12B in form of a cross-bar 12B of the auxiliary terminal 12 as shown in FIG. 4A or to the horizontal portion of the terminal 12 as shown in FIG. 4B, it shall be noted that a considerable mechanical force is needed for the insertion of the press-fit terminal 12. The assembly board 30 can be a control board realized for example as a printed circuit board.

As schematically shown in FIGS. 4A and 4B, the assembly board 30 may be arranged at a vertical position on top of the power module 100. In the presence of the alignment part 20, the terminals 12 or the vertical portions of the terminals can be positioned and aligned with respect to the contact holes 30H of the assembly board 30 in lateral X-direction and Y-direction. For electrically interconnecting the power module 100 with the assembly board, the terminals 12, which are formed for example as press-fit terminals 12 as shown in FIGS. 4A and 4B, are inserted or pressed into the contact holes 30H of the assembly board 30.

The terminal 12 is formed from an electrically conductive material or has an outer metallization. As shown in FIGS. 4A and 4B, inside and partly outside the contact hole 30H, the assembly board 30 may be provided with a contact layer 30C for having an electrical contact with the terminal 12. The contact layer 30C may be a metallization, e.g. made of copper with optional coating.

The terminal 12 or the vertical portion of the terminal 12 comprises an upper part 12A and a lower part 12L. Only the upper part 12A protrudes beyond the recessed portion 20R of the alignment part 23 and is inserted into the contact hole 30C. The lower part 12L of the terminal 12 is located inside the recessed portion 20R, for instance completely inside the recessed portion 20R.

As shown in FIGS. 4A and 4B, the terminal 12 comprises a laterally extending structure 12B for instance in form of a cross-bar 12B. The cross-bar 12B can have a greater lateral cross section or extension than the upper part 12A and/or the lower part 12L of the terminal 12. For example, the cross-bar 12B has the largest lateral cross section or extension of the terminal 12 or of the vertical portion of the terminal 12. The cross-bar 12B is configured for mechanically supporting and/or anchoring the terminal 12 to the alignment part 20. Here, the alignment part 20 has a corresponding support or holding structure for receiving the cross-bar 12B. Apart from FIGS. 4A and 4B, the laterally extending structure 12B can have another geometry, for example, is formed as a one-sided bar.

The recessed portion 20R of the alignment part 20 can comprise a holding structure 20M which is configured for holding and mechanically supporting the terminal 12, for example when the terminal 12 is pressed along the vertical direction towards a forward direction, for instance towards the assembly board 30. Alternatively, it is possible that the assembly board 30 is pressed towards the terminal/s 12.

As shown in FIG. 4A the holding structure 20M is provided by a step-like structure of an inner wall 20W of the recessed portion 20R. The step-like structure can form a reception portion for receiving and holding the terminal 12. In this case, the cross-bar 12B of the terminal 12 is arranged or can hang on a stepping surface 20Z of the step-like structure. Thus, the recessed portion 20R or the alignment part 20 provides mechanical support for the terminal 12, for instance when the alignment part 20 is pressed along the vertical Z-direction and for instance the press-fit parts of the terminals are inserted into the contact holes 30H of the assembly board 30, or vice versa, as shown on the right hand side of FIG. 4A. Hence, the recessed portion 20R provides an alignment of the terminal 12 in Z-direction.

As shown in FIG. 4B, it is possible that the holding structure 20M is provided by a bottom area 20B of the recessed portion 20R. In this case, a lower horizontal part 12L of the terminal 12 can be arranged on the bottom area 20B of the recessed portion 20R and thus is mechanically supported by the bottom area 20B.

Here, it is noted that if the terminal 12 is a flexible auxiliary terminal 12, it shall be supported in the vertical direction on the laterally extending structure 12B, for example on the cross-bar 12B close to the press-fit zone, for instance at the stepping surface 20Z of the inner wall 20W as shown in FIG. 4A for avoiding the risk that the flexible auxiliary terminal 12 would be deformed during inserting and/or pressing the flexible auxiliary terminal 12 into the contact hole 30H. Support on the bottom area 20B as shown in FIG. 4B can be used for standard pin terminals or for a mechanically stable terminal, for example for the main terminal 13 or a thicker terminal.

Figure 4C:
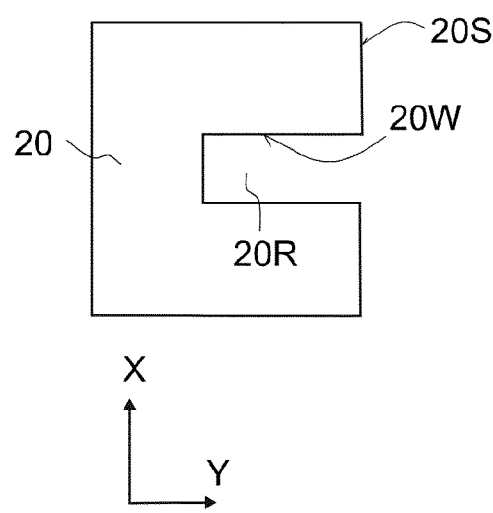
FIGS. 4C and 4D show some exemplary layouts of the recessed portion of the alignment part.
Figure 4D:
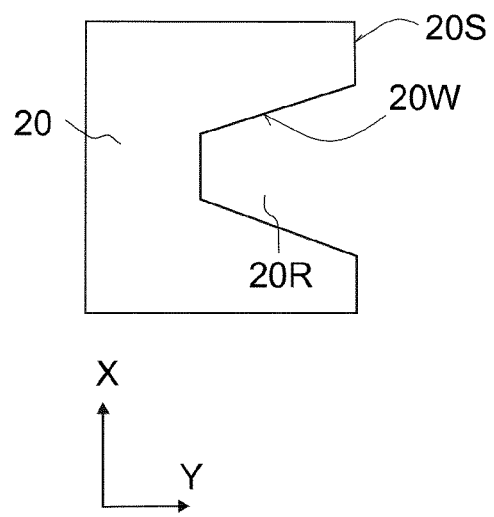

FIGS. 4C and 4D show some exemplary layouts of the cross-section of the recessed portion 20R in a XY-plane. The recessed portion 20R can be formed as a slot having rectangular shape with straight walls as shown in FIG. 4C or as a slot having trapezoidal shape as shown in FIG. 4D. The layout of cross-section of the recessed portion 20R, however, is not restricted to the layouts shown in FIGS. 4C and 4D. The recessed portion 20R can also be formed as a slot having curved walls or having a V-shape, for example. Thus, as shown in FIGS. 4A to 4D, the recessed portion 20R formed for instance as vertical slot can be used for positioning and aligning the terminal 12 in the lateral X- and Y-directions and for mechanically supporting and aligning the terminal 12 in the vertical Z-direction. The positioning and aligning the terminal 12 in the lateral X- and Y-directions can be provided by the sidewalls and end walls of the recessed portion 20R. The mechanical support of the terminal 12 in the vertical Z-direction can be provided by the bottom area 20B and/or by a reception portion—also called as boss—formed for instance as a step-like structure on the inner wall of the recessed portion 20R. As shown in FIG. 4A, the reception portion is configured for receive the laterally extending structure 12B for instance in form of a cross-bar 12B of the terminal 12.

Figure 5:
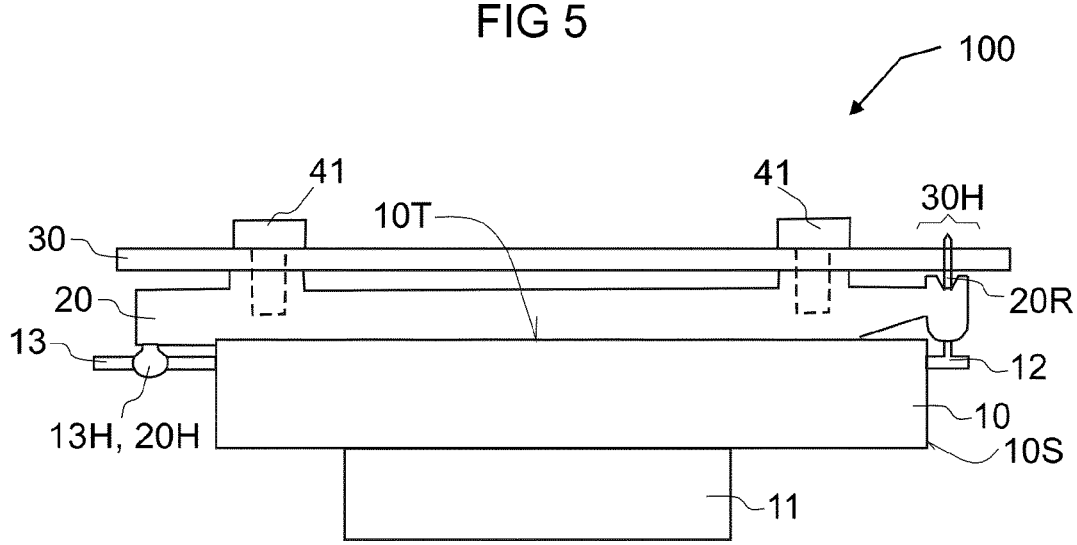
FIGS. 5 and 6 show some examples of the power module interconnected to an assembly board.

FIG. 5 shows a snap-fit connection between the module component 10 and the alignment part 20. The snap-fit connection can be formed by a snap-fit portion 20H of the alignment part 20 and a snap-fit opening of the main terminal 13. The snap-fit portion 20H is for example a button-like protrusion of the alignment part 20. The snap-fit portion 20H can be inserted into the snap-fit opening 13H of the main terminal 13. For example, the snap-fit portion 20H is made of an elastic material and has in places a larger cross-section than the snap-fit opening 13H of the main terminal 13. The snap-fit portion 20H can be temporarily deformed when inserting into the snap-fit opening 13H of the main terminal 13. In a plane view of the top surface 10T of the module component 10, the snap-fit connection is realized outside the top surface 10T. This snap-fit connection also provides a correct alignment of the alignment part 20 with respect to the module component 10.

A mechanical fastening of the power module 100 to the assembly board 30 can be realized also by screws, for instance by first screws 41 as shown in FIG. 5. The first screws 41 extend along the vertical direction throughout the assembly board 30 into the alignment part 20. The first screws 41, however, do not extend throughout the alignment part 20.

According to FIG. 5, the module component 10 is arranged on a carrier 11. The carrier 11 can be a baseplate, a cooler or a heat sink, but is not restricted thereto.

Figure 6:
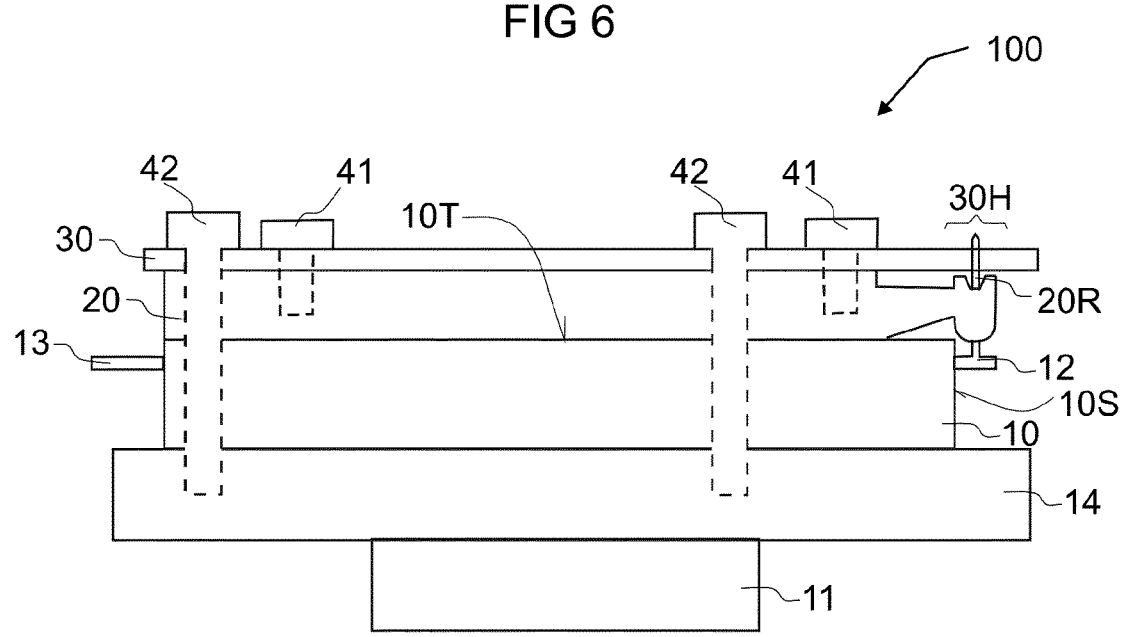

FIG. 6 shows another setup of the power module 100 connected to the assembly board 30, wherein the power module 100 comprises at least one module component 10 and the alignment part 20. The power module 100 further comprises a printed circuit board 14 and the carrier 11, wherein the printed circuit board 14 is arranged between the carrier 11 and the module component 10. For having an additional fixation, further screws, for instance second screws 42 may be used, wherein the second screws 42 fix the assembly board 30 not only to the alignment part 20 but also to the module component 10 and to the printed circuit board 14. Thus, along the vertical direction, the common second screws 42 extended throughout the assembly board 30, the alignment part 20 and the module component 10 into the printed circuit board 14.

It is also possible that the fixation of the alignment part 20 to the module component 10 is realized by screws (to a module body or to main terminals similar to Snap-fit connection). Similar to FIG. 6, it is possible that the screw extends to the carrier 11 under the power module 100, so that complete setup is fixed by screws. Other possibilities for fixing and/or aligning the alignment part 20 to the power module 100 or the module component 10 comprise for example clamping connections, pin-to-hole connections, snap-fit connections, the use of bedstop structures and/or the use of guiding structures like guiding rails.

Moreover, apart from FIGS. 1 to 6, the alignment part 20 can comprise a plurality of recessed portions 20R for receiving a plurality of terminals 12. For the purpose of alignment along the lateral X- and Y-directions and for the purpose of mechanical support along the vertical Z-direction, each of the plurality of terminals 12 can be arranged within one of the recessed portions 20R. It is possible that one single alignment part 20 is fixed to more than one module component 10, for example to three module components 10, e.g. arranged in a row, forming a so-called Sixpack module which can comprise three module components 10 mounted on a carrier 11 being a cooler. Before and after mounting the power module 100 to the assembly board 30, the alignment part 20 remains on top of the module component/s 10. For example, the alignment part 20 is located between the assembly board 30 and the module component/s 10 or between the assembly board 30 and a module housing of the power module 100 or of the module component/s 10.

FIGS. 7A, 7B, 7C and 7D show some method steps for the fixation of the alignment part 20 to the module component 10 using a snap-fit connection. Apart from the snap-fit connection, further screws, for instance third screws 43 as shown in FIG. 8C, or a bonding layer 40 as shown in FIG. 2A or 2B may also be used. It is also possible to use screws between the alignment part 20 and the terminals 12/13.

Figure 7A:
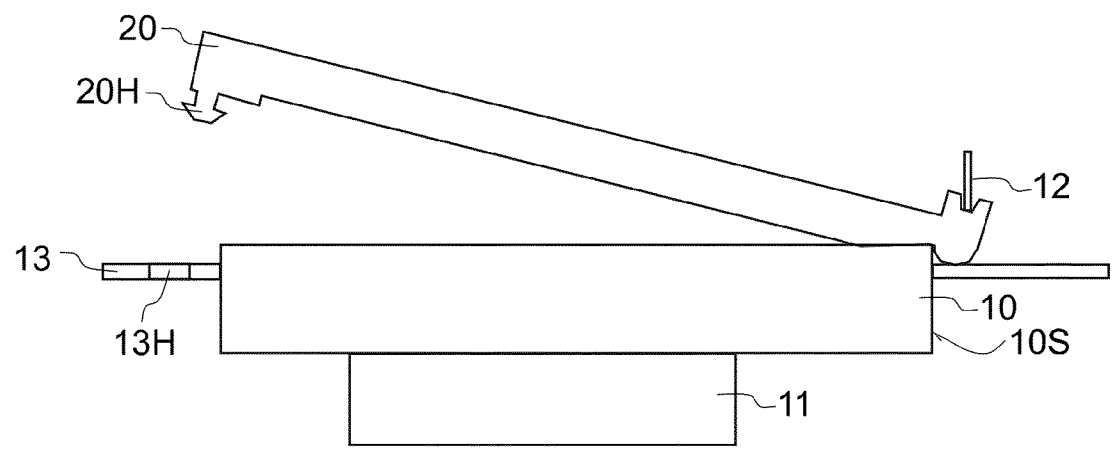
FIGS. 7A, 7B, 7C, 7D, 8A, 8B and 8C show some method steps for fixing the alignment part on a top surface of a semiconductor module component.
Figure 7B:
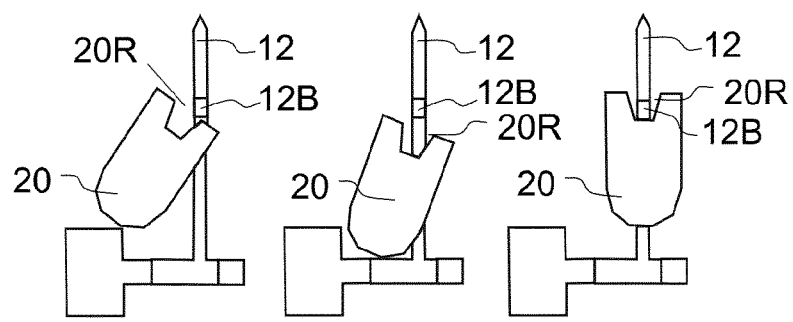
Figure 7C:
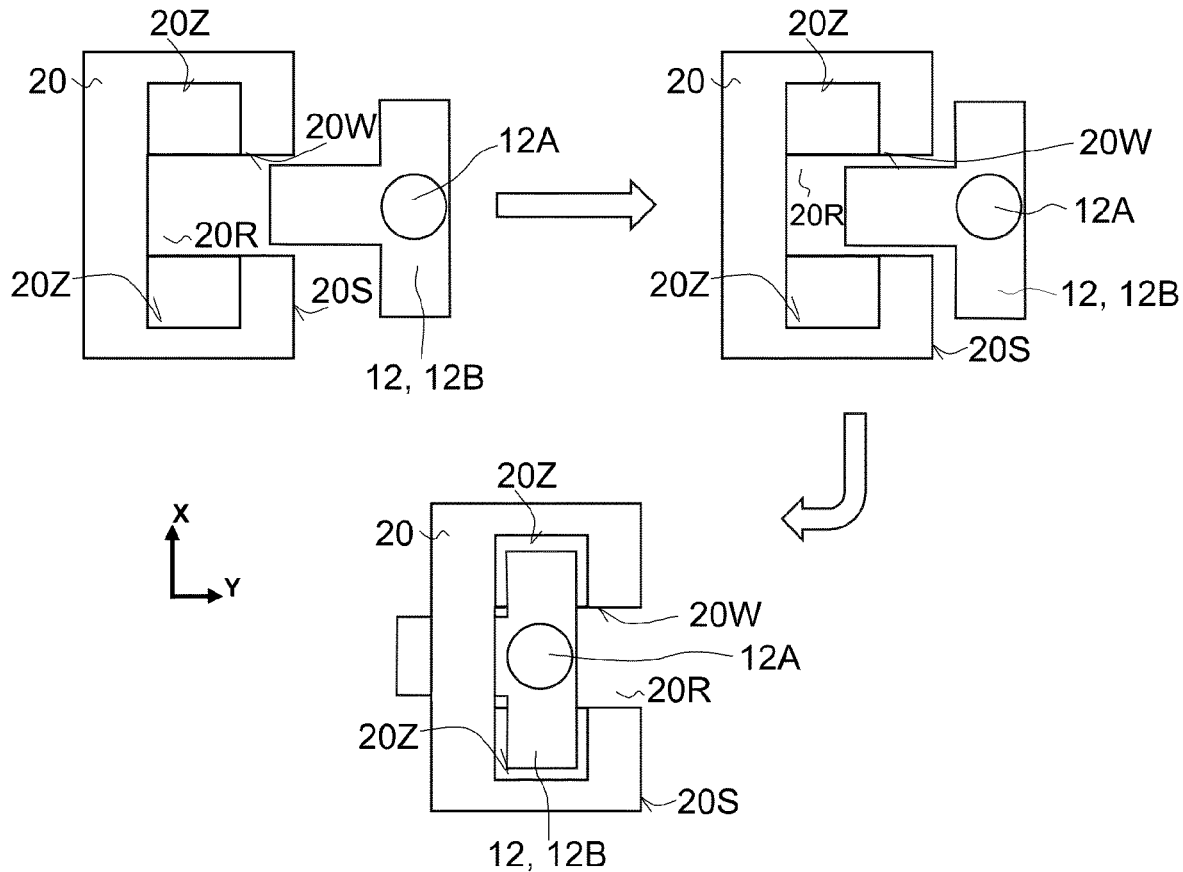
Figure 7D:
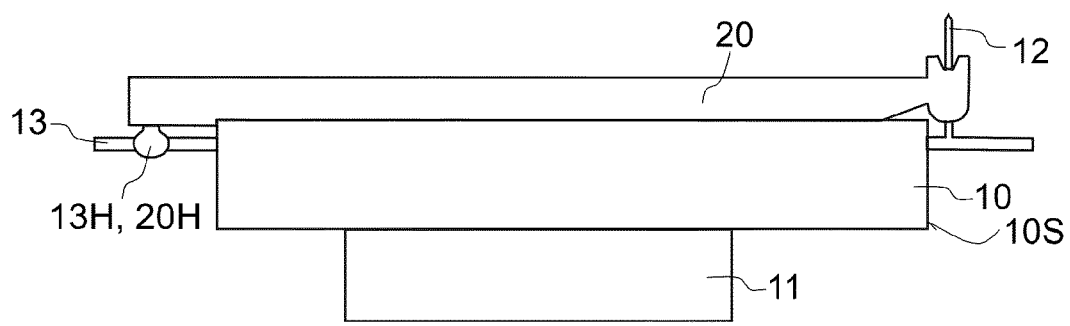

As shown in FIGS. 7A and 7B, the alignment part 20 is moved in lateral direction towards the terminal 12 or towards a row of the terminals 12 in a tilted orientation so that the terminal/s 12, for instance the press-fit terminal/s 12 can be inserted into the recessed portion/s 20R of the alignment part 20. The recessed portion 20R provides an alignment in a direction orthogonal to the orientation of the terminal 12. Subsequently, the alignment part 20 is moved into the horizontal direction as shown in FIGS. 7C and 7D. Thus, possible laterally extending structure/s 12B of the terminal/s 12 can be inserted into reception portion/s of the recessed portion/s 20R and located on the corresponding bosses or notches of the reception portion/s. First FIG. 7C shows—in top view—some different positions of the terminal 12 relative to the recess 20R of the alignment part 20. The different positions of the terminal 12 relative to the recess 20R of the alignment part 20 shown in FIG. 7C may correspond to the different positions of the terminal 12 relative to the alignment part 20 shown in FIG. 7B.

The terminal 12 has a laterally extending structure 12B in form of a cross-bar. The recess 20R has stepping surfaces 20Z for receiving and supporting the laterally extending structure 12B. Once the laterally extending structure 12B is arranged on the stepping surfaces 20Z, an alignment of the terminal 12 is achieved not only in the lateral directions but also in the vertical direction.

According to FIG. 7D, when the alignment part 20 reaches the horizontal orientation, the terminal 12 has a proper alignment in the direction parallel to the orientation of the terminals 12 and in the vertical direction. Finally, the alignment part 12—which is also formed as a support part for the terminal/s 12—is mechanically fixed to the main terminal/s 13, which can be formed as power terminals, by the use of snap-fit/s in hole/s formed as snap-fit opening/s 13H of the main terminal/s 13 or at the side of main terminal/s 13. After that the assembly board 30 may be mounted to the power module 100.

Figure 8A:
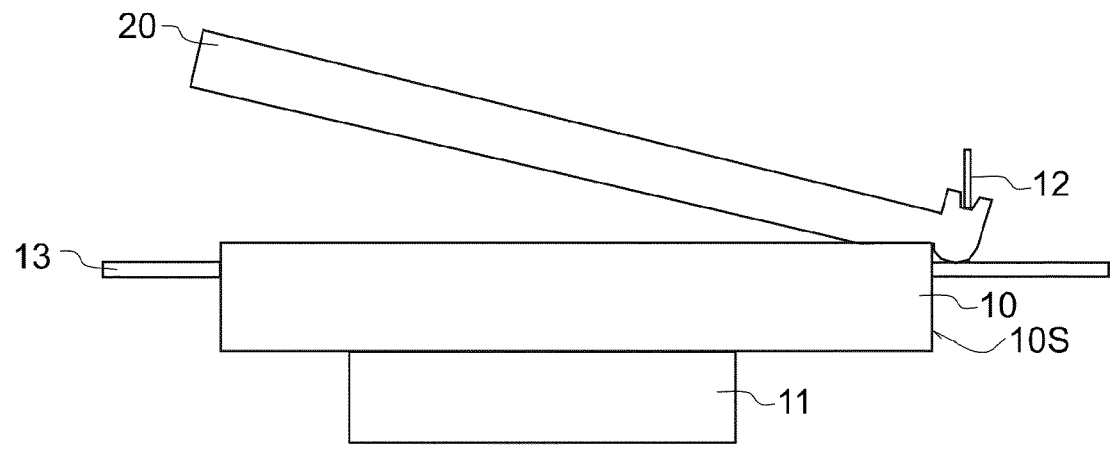
Figure 8B:
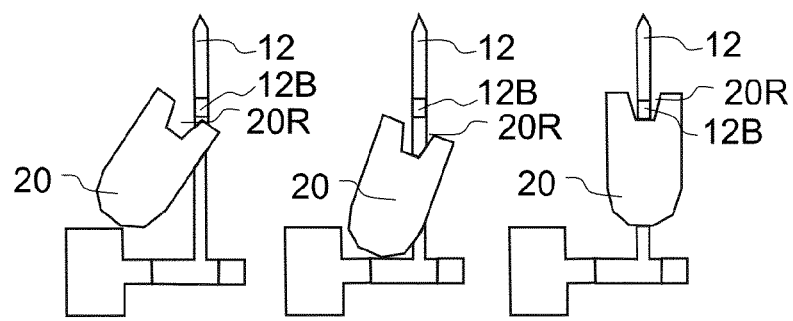
Figure 8C:
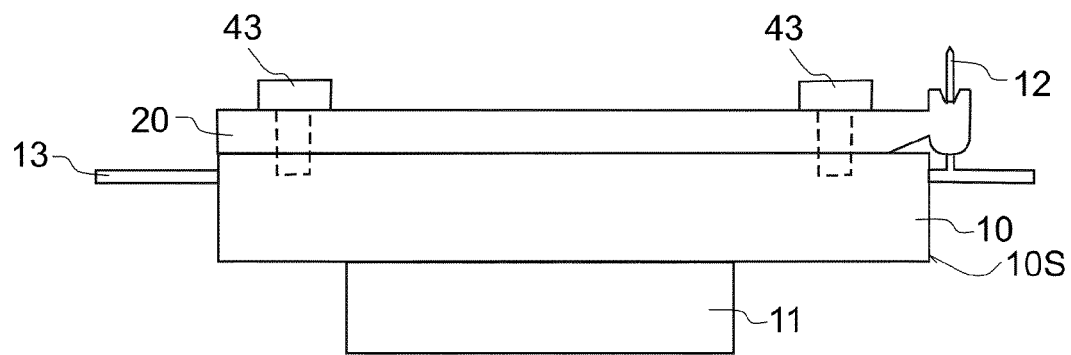

FIGS. 8A, 8B and 8C show some method steps for the fixation of the alignment part 20 to the module component/s 10 using screws 43. The method steps described in FIGS. 8A and 8B are substantially identical to the method steps shown in FIGS. 7A and 7B, except that the alignment part 20 does not have snap-fit portion/s 20H.

According to FIG. 8C, the fixation can be done by screwed connections with the module component/s 10, for instance with encapsulation/s or with the main terminals 13 of the module component/s 10. The screws, here the third screws 43, extend along the vertical direction throughout the alignment part 20 into the module component/s 10. Further or additional methods for the fixation of the alignment part 20 are also possible, for instance gluing the alignment part 20 on the module component/s 10 or any type of clamping the alignment part 20 to the module component/s 10 may be also used. These fixing methods are also applicable for the further mounting of the alignment board 20.

The embodiments shown in the Figures as stated represent exemplary embodiments of a power module and methods for fixing an alignment part to at least one module component or for connecting the power module to an assembly board; therefore, they do not constitute a complete list of all embodiments according to the improved arrangement for the power module or the methods. Actual arrangements of the power module or of the methods may vary from the exemplary embodiments described above.

This application claims the priority of the European patent application 22 194 844.1, the disclosure content of which is hereby included by reference.

REFERENCE SIGNS 100 power module
10 semiconductor module component
10S side surface of the semiconductor module component
10T top surface of the semiconductor module component
11 carrier
12 terminal of the semiconductor module component
12A upper part of the terminal
12B laterally extending structure or cross-bar of the terminal
12L lower part of the terminal
13 main terminal of the semiconductor module component
13H snap-fit opening of the main terminal/of the semiconductor module component
14 circuit board
20 alignment part
20H snap-fit portion of the alignment part
20R recessed portion of the alignment part
20S side surface of the alignment part
20B bottom area of the recessed portion
20M holding structure of the recessed portion/of the alignment part
20W inner wall of recessed portion
20Z stepping surface of the inner wall
30 assembly board
30C contact layer of the assembly board
30H contact hole of the assembly board
40 bonding layer
41 first screw
42 second screw
43 third screw
50 shielding layer
X lateral direction/horizontal direction
Y lateral direction/longitudinal direction
Z vertical direction

The invention claimed is:

1. Power module comprising a semiconductor module component and an alignment part, wherein
the alignment part is fixed on a top surface of the semiconductor module component and comprises at least one recessed portion,
the semiconductor module component comprises at least one terminal which has a vertical portion being perpendicular to the top surface of the semiconductor module component and thus is orientated vertically with respect to the top surface of the semiconductor module component, wherein for the purpose of alignment along a lateral direction being parallel to the top surface of the semiconductor module, and for providing the at least one terminal with additional mechanical support along the vertical direction,
the at least one terminal is located at least partly within the at least one recessed portion, along a vertical direction being perpendicular to the top surface of the semiconductor module component, the at least one terminal protrudes beyond the at least one recessed portion, and
the at least one recessed portion is located on a side surface of the alignment part, wherein in a plan view of the top surface of the semiconductor module component, the at least one recessed portion and the at least one terminal are located outside the top surface of the semiconductor module component, wherein the at least one recessed portion is formed as a slot extending along the vertical direction through the alignment part, characterized in that the slot is an open recess on the side surface of the alignment part, and wherein the slot is not a through-hole being completely surrounded by inner walls of the at least one recessed portion in the lateral direction.

2. The power module according to claim 1, wherein the alignment part is electrically insulating.

3. The power module according to claim 1, wherein the terminal further comprises a lateral portion, and
the lateral portion is parallel to the top surface of the semiconductor module component and laterally protrudes beyond a side surface of the semiconductor module component and thus is directed vertically with respect to the side surface of the semiconductor module component.

4. The power module according to claim 1, wherein the at least one recessed portion comprises a holding structure which is configured for mechanically supporting the at least one terminal when the at least one terminal is pressed or inserted along the vertical direction towards a forward direction.

5. The power module according to claim 4, wherein
the holding structure is provided by a step-like structure of an inner wall of the at least one recessed portion, and
the at least one terminal comprises a laterally extending structure being arranged on a stepping surface of the step-like structure.

6. The power module according to claim 4, wherein
the holding structure is provided by a bottom area of the at least one recessed portion, and
a lower part of the at least one terminal is arranged on the bottom area of the at least one recessed portion.

7. The power module according to claim 1, comprising a shielding layer configured for protecting the semiconductor module component against electromagnetic interference, wherein shielding layer is embedded within the alignment part or is arranged on a top surface or on a bottom surface of the alignment part.

8. The power module according to claim 1, wherein the alignment part is mechanically connected to the semiconductor module component by a bonding layer.

9. The power module according to claim 1, wherein the alignment part is mechanically connected to the semiconductor module component by a snap-fit connection or by a clamping connection or by a pin-to-hole connection or by screws.

10. The power module according to claim 1, wherein the at least one terminal is a pin-shaped terminal or a press-fit terminal.

11. The power module according to claim 1, wherein
the alignment part comprises a plurality of recessed portions including the at least one recessed portion,
the semiconductor module component comprises a plurality of terminals including the at least one terminal,
for the purpose of alignment along the lateral direction and for the purpose of mechanical support along the vertical direction, each of the plurality of terminals is located at least partly within one of the recessed portions.

12. The power module according to claim 1, wherein the power module is integrated into an arrangement comprising an assembly board, wherein the power module and the assembly board are arranged one above the other along the vertical direction, and the assembly board has at least one contact hole in which the at least one terminal of the semiconductor module component is inserted.

13. A method for fixing an alignment part comprising at least one recessed portion to a semiconductor module component comprising at least one terminal comprising:

positioning the alignment part in a tilted orientation with respect to a top surface of the semiconductor module component for inserting the at least one terminal, which has a vertical portion being perpendicular to the top surface of the semiconductor module component and thus being orientated vertically to the top surface of the semiconductor module component, at least partly into the at least one recessed portion of the alignment part, wherein the at least one recessed portion is located on a side surface of the alignment part, wherein in a plan view of the top surface of the semiconductor module component, the at least one recessed portion and the at least one terminal are located outside the top surface of the semiconductor module component, wherein the at least one recessed portion is formed as a slot extending along a vertical direction through the alignment part, the slot being an open recess on the side surface of the alignment part, and wherein the slot is not a through-hole being completely surrounded by inner walls of the at least one recessed portion in lateral directions, and wherein the vertical direction is perpendicular to the top surface of the semiconductor module component;

moving the alignment part towards the top surface of the semiconductor module component so that the alignment part reaches a horizontal orientation with respect to the top surface of the semiconductor module component, wherein along the vertical direction, the at least one terminal protrudes beyond the at least one recessed portion, and wherein the at least one recessed portion is configured for aligning the at least one terminal in the lateral direction and for providing the at least one terminal with additional mechanical support along the vertical direction; and fixing the alignment part to the semiconductor module component for forming a power module comprising the alignment part and the semiconductor module component.

14. The method according to claim 13, further for electrically connecting the power module to an assembly board comprising:

positioning the power module and the assembly board one above the other along the vertical direction, wherein the assembly board has at least one contact hole for receiving the at least one terminal of the semiconductor module component, and inserting the at least one terminal into the at least one contact hole, wherein the at least one recessed portion of the alignment part comprises a holding structure which carries and mechanically supports the at least one terminal when the at least one terminal is inserted or pressed into the at least one contact hole.

* * * * *